Oct. 14, 1969 A. W. MASSMAN 3,473,080
DUAL MODE TRANSISTORIZED OSCILLATOR
Filed June 19, 1967
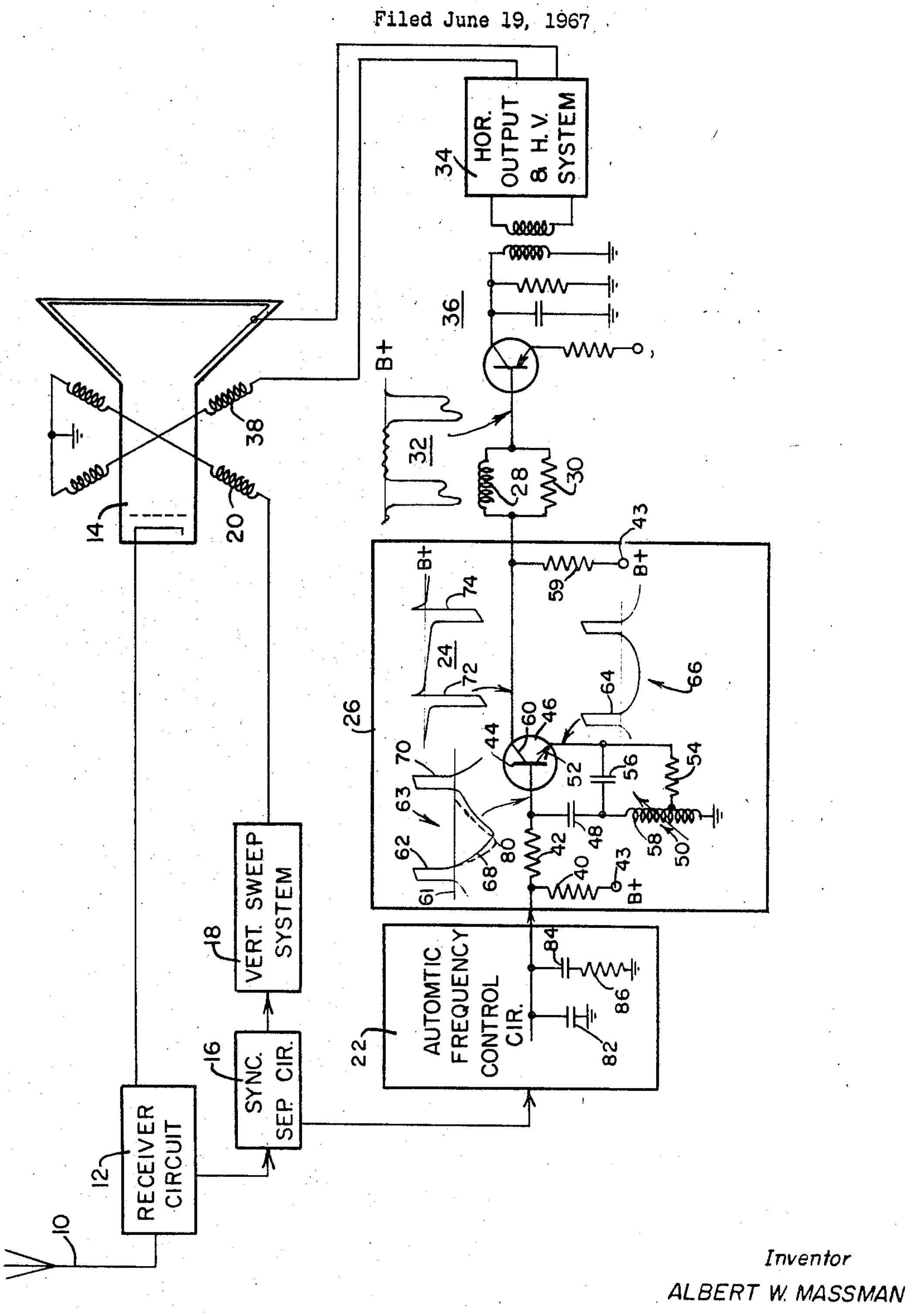
Inventor
ALBERT W. MASSMAN
BY Mueller, Aichele & Rauner
ATTYS.

3,473,080
Patented Oct. 14, 1969

3,473,080
DUAL MODE TRANSISTORIZED OSCILLATOR

Albert W. Massman, Wheaton, Ill., assignor to Motorola, Inc., Franklin Park, Ill., a corporation of Illinois Filed June 19, 1967, Ser. No. 647,058
Int. Cl. H01j 17/36
U.S. Cl. 315—27 3 Claims

ABSTRACT OF THE DISCLOSURE

The oscillator transistor is biased into conduction to close a first circuit loop including an inductor. When the transistor saturates, the field in the inductor collapses to open the loop and form a pulse. Components forming a second circuit loop are coupled across the transistor input and are responsive to termination of the pulse to be rung at a resonant frequency to produce a sine wave which maintains the transistor non-conductive to form pulses at the oscillator output.

BACKGROUND OF THE INVENTION

A television receiver includes horizontal and vertical sweep systems to horizontally and vertically deflect an electron beam of a cathode ray tube to form a raster. The horizontal system includes an oscillator to develop pulses for driving the output circuitry which in turn couples a sawtooth current through the horizontal deflection yoke. In order that the frequency of the oscillator pulses be the same as that of the transmitted television signal, an automatic frequency control (AFC) circuit converts synchronizing pulses in the television signal into a DC voltage to automatically control the frequency of the oscillator.

In the past, the construction of the oscillator necessitated rather large iapacitors so that three would be more power required to maintain synchronization within a desired frequency range. In addition, the fact that the capacitors were large, made them costly. Lastly, the configuration of presently known oscillators cause them to be unstable and susceptible to changes in supply voltage, temperature and gain of the device used in the oscillator to thereby undesiraby cause variations in the amplitude and frequency of the oscilator pulses.

SUMMARY OF THE INVENTION

It is, therefore, an object of this invention to provide a low cost transistorized oscillator which has increased sensitivity to the AFC voltage to decrease the power required to synchronize the oscillator within a desired frequency range.

A further object of this invention is to improve the stability of a transistorized oscillator by including means to introduce a sine wave to positively maintain the transistor non-conductive between pulses.

Another object is to provide a transistorized oscillator for producing pulses with an amplitude and a frequency substantially independent of the gain of the transistor, the ambient temperature, and supply voltage variations by using the transistor in a switch-type mode of operation.

In practicing the invention, the input electrode of a transistor is coupled through an inductor to ground. Coupling means are connected between the common electrode of the transistor to a tap on the inductor to form a first circuit loop. Bias means are coupled across the input and common electrodes to provide a voltage to render the transistor conductive to regeneratively close the first circuit loop. When the transistor saturates, the field in the inductor collapses to regeneratively open the first circuit loop and thereby form a pulse which maintains the transistor conductive for the duration thereof. A capacitor is coupled between the inductor and the common electrode, and along with the coupling means forms a second circuit loop. When the first circuit loop is opened, the second loop rings at its resonant frequency to produce a sine wave poled oppositely to the pulse to positively maintain the transistor non-conductive for the duration thereof. A resistor in the second loop lowers its Q and thereby limits the sine wave amplitude. The pulse alternates with the sine wave to form a control signal for the transistor to cause a series of pulses to appear on the output electrode of the transisto rrecurring at the resonant frequency of the second circuit loop.

DESCRIPTION OF THE DRAWING

The drawing illustrates a television receiver partially in block and partially in schematic incorporating the features of the invention.

DETAILED DESCRIPTION OF THE PREFERRED EMBODIMENT

Referring now to the television receiver illustrated in the drawing, a television signal is received by antenna 10 and processed in a known manner by a receiver circuit 12 to produce video information for a cathode ray tube 14. Vertical synchronizing signals are separated from the video information in a synchronizing signal separator circuit 16 and are applied to a vertical sweep system 18 which develops a sawtooth current for application to the vertical yoke on the neck of the cathode ray tube 14 for vertically deflecting an electron beam thereof. Horizontal synchronizing signals are separated from the video information in circuit 16 and are applied to the automatic frequency control (AFC) circuit 22 which develops a DC control voltage to control the frequency of the pulsating signal 24 developed by a dual mode transistorized oscillator 26. The pulse durations are lengthened in the parallel combination of inductor 28 and resistor 30 to provide the pulsating signal 32 which maintains the switching device in the horizontal output and high voltage system 34 non-conductive for retrace and for the initial part of trace for purposes known to those skilled in television art. The pulsating signal 32 is amplified in the driver stage 36 and applied to the system 34 which in turn applies a sawtooth current through the horizontal yoke 38 for horizontally sweeping the electron beam in cathode ray tube 14. System 34 also provides high voltage for the final anode of cathode ray tube 14.

Referring now more specifically to the oscillator 26, a pair of biasing resistors 40 and 42 are coupled in series between a source of DC voltage 43 to the base 44 of and NPN transistor 46. A capacitor 48 and an inductor 50 are coupled in series between the input electrode or base 44 and a reference potential. The common electrode or emitter 52 of transistor 46 is coupled to a tap on inductor 50 through a resistor 54 to form a first circuit loop comprising base 44, emitter 52, resistor 54, inductor 50 and capacitor 48. A second circuit loop of the oscillator 26 includes a capacitor 56, inductor 50, and resistor 54 with the resonant frequency thereof determined by the capacitor 56 and the inductor 50. Resistor 59 connected from the collector 60 to DC source 43 provides a load for transistor 46.

When the television receiver is turned on, the oscillator is driven into a first mode of operation during which the DC source 43 applies a bais voltage through resistors 40 and 42 to rapidly charge capacitor 48 to provide a positive voltage on the base 44 which exceeds the transistor conductor level 61 to render the transistor 46 slightly conductive. A positive increase on the emitter 52 due to emitter follower action is applied through resistor 54 to the tap of inductor 50. The increase is stepped up by the turns ratio of the inductor 50 (inductance of the lower portion of inductor 50 to the total inductance thereof) and is coupled to the base 44 to reinforce the positive voltage occurring thereat which in turn increases the voltage on emitter 52 and so on to regeneratively render transistor 46 heavily conductive and thereby close the first circuit loop. As the transistor approaches saturation, the rate of change of current in the inductor 50 decreases until the current no longer changes at which time the field built up in the inductor begins to collapse. This causes the transistor 46 to start to cutoff so that the voltage on emitter 52 begins to decrease, which decrease is regeneratively fed back to the base 44 to regeneratively render the transistor 46 nonconductive and thereby open the first circuit loop. The first mode of operation thus far described, causes a pulse 62 which forms part of a control signal 63, to appear on the base 44, and due to the emitter follower action of transistor 46, a similarly shaped pulse 64 forming part of the signal 66 appears on the emitter 52. It should be noted that the tip of the pulse 62 is not flat because the current through the inductor does continue to rise slightly until the transistor becomes completely saturated.

Termination of pulse 64 drives the oscillator 26 into a second mode of operation by ringing the second circuit loop consisting of capacitor 56, inductor 50 and resistor 54 at its resonant frequency to produce a sine wave 68 and thereby form the second part of the control signal 63 on the base 44. The resistor 54 is extremely important in the operation of the oscillator because it lowers the Q of the second loop sufficiently to limit the "amount" or percentage of the sine wave in control signal 63. Without the resistor, the pulse 62 would be almost nonexistent and the oscillator would operate in a single mode and the control signal 63 would have the appearance of a sine wave. After termination of the sine wave portion, the base voltage again reaches the conduction level 61 to thereby prepare the oscillator 26 to form a new pulse 70. The pulses 62 and 70 are of the proper polarity and magnitude to saturate transistor 46 and thereby cause corresponding pulses 72 and 74 which form part of the pulsating signal 24 to appear on the collector 60. The pulses 72 and 74 are coupled to driver circuit 36 as previously explained. As the tap on the inductor 50 is moved down, the amount of feedback is increased and the duration of the pulses 62 and 70 is increased. However, too much feedback may cause reverse breakdown between the base and emitter. In a practical construction, the tap was one-third the way up the inductor.

The pulses 72 and 74 swing from a maximum value equal to the quiescent voltage on collector 60 down to a minimum value but the peaks have a constant amplitude because if the amplitude is any more negative with respect to the corresponding pulses on the base 44, base-to-collector conduction occurs and the pulses would be clipped. Thus it may be appreciated that the peak-to-peak amplitude of the pulses 72 and 74 will be independent of the gain of the transistor 46 because the transistor is used as a switch by saturating it, and because the base-to-collector conduction level is substantially constant. For similar reasons, the peak-to-peak amplitude will not change with ambient temperature or with changes in the supply voltage.

The time duration between pulses 62 and 70 will be the inverse of the resonant frequency of the second circuit loop and therefore will recur at such resonant frequency. The sine wave portion 68, is of a polarity with respect to the conduction level 61 to positively maintain the transistor 46 non-conductive for the duration thereof so that the pulses 72 and 74 which appear on the collector 60 likewise recur at the resonant frequency of the second circuit loop. The sine wave portion 68 increases oscillation stability and therefore maintains constant frequency output pulses because substantially all of such portion is below the conduction level 61 to positively maintain the transistor non-conductive for the duration thereof and thereby reduce the possibility of an output pulse appearing at the wrong instant of time.

The DC voltage from AFC circuit 22 controls the frequency of pulses 72 and 74 by adding to or subtracting from the voltage supplied by the DC source 42. An advantage of stabilization by using a sine wave permits a slight change in the AFC voltage to have substantial effect on the frequency. This is due to the fact that the sine wave has a substantial slope to it so that moving it up or down with respect to the conduction level 61 has a marked effect. Manual frequency control is effected by varying the inductance of inductor 50. For example, the frequency of the pulsating signal 24 may be increased by increasing the resonant frequency of the second circuit loop as indicated by the dotted line 80 to cause the sine wave to reach the conduction level 61 earlier.

In a television receiver, the capacitor 56 and the inductor 50 would have values to cause its resonant frequency to be approximately 15,750 Hz. so that the duration between pulses is about 52 microseconds. The amount of feedback is selected to cause the duration of the pulses 62 and 60 to be on the order of 11.5 microseconds to provide the necessary 63.5-microsecond sweep time. These durations were obtained with the following component values.

| | | |
|---|---|---|
| Resistor **40** | ohms | 82,000 |
| Resistor **42** | do | 2,700 |
| Source **39** | volts | 12.5 |
| Capacitor **48** | microfarad | .01 |
| Inductor **50** | millihenries | 32 |
| Resistor **54** | ohms | 150 |
| Capacitor **56** | microfarad | .01 |
| Resistor **59** | ohms | 270 |

Since the value of the capacitors 48 and 56 are substantially smaller than those that have been used heretofore in horizontal oscillators, minimum power is required to maintain the oscillator in sync within a given frequency range and the oscillator is cheaper to build.

What has been described, therefore, is an improved transistorized oscillator especially adapted for use in a horizontal sweep system of a television receiver and in which due to its dual mode of operation has improved stability, reduced cost, and minimum susceptability to variations in gain of the transistor, the supply voltage or ambient temperature.

I claim:

1. A transistorized oscillator including in combination: transistor means having input, common and output electrodes, an output circuit coupled to said output electrode, first capacitor means coupled to said input electrode and inductor means coupled between said first capacitor means and a reference potential, said inductor means having a tap, resistance means coupled between said common electrode and said tap and forming a first circuit loop with said input and common electrodes, said first capacitor means and said inductor means, bias means coupled across said input and common electrodes to provide a voltage to render said transistor means conductive to regeneratively close said first circuit loop thereby building up a field in said inductor means, which field collapses when said transistor means becomes saturated to regeneratively open said first circuit loop, said regenerative opening and closing of said first circuit loop acting to form a pulse to maintain said transistor means conductive for the duration thereof, second capacitor means coupled to the junction of said first capacitor means and said inductor means and to said common electrode and along with said resistance means and said inductor means forming a second circuit loop, said second circuit loop being responsive to the opening of said first circuit loop to be rung at the resonant frequency thereof to produce a sine wave poled oppositely to said pulse to positively maintain said transistor means non-conductive for the duration thereof, said pulse alternating with said sine wave to form a control signal for said transistor means to cause a series of pulses to appear in said output circuit recurring at said resonant frequency.

2. The transistorized oscillator set forth in claim 1 wherein said inductor means is variable to select the frequency of said sine wave to thereby select the frequency at which said series of pulses in said output circuit recur.

3. In a television receiver having a cathode ray tube with a deflection yoke thereon, a horizontal deflection system including an output circuit for energizing the yoke, a transistorized oscillator including in combination; transistor means having input, common and output electrodes, circuit means coupling said output electrode to said output circuit, first capacitor means coupled to said input electrode and inductor means coupled between said first capacitor means and a reference potential, said inductor means having a tap, resistance means coupled between said common electrode and said tap and forming a first circuit loop with said input and common electrodes, said first capacitor means and said inductor means, means coupled to said input electrode to supply an automatic frequency control voltage thereto, bias means coupled to said input electrode to provide a voltage to render said transistor means conductive to regeneratively close said first circuit loop thereby building up a field in said inductor means, which field collapses when said transistor means becomes saturated to regeneratively open said first loop, said opening and closing of said first circuit loop acting to form a pulse to maintain said transistor means conductive for the duration thereof, second capacitor means coupled to the junction of said first capacitor means and said inductor means and to said common electrode and along with said resistance means and at least a portion of said inductor means forming a second circuit loop, said second circuit loop being responsive to the opening of said first circuit loop to be rung at the resonant frequency thereof to produce a sine wave poled oppositely to said pulse to positively maintain said transistor means nonconductive for the duration thereof, said pulse alternating with said sine wave to form a control signal for said transistor means to cause a series of pulses to appear on said output electrode recurring at said resonant frequency.

References Cited

UNITED STATES PATENTS 2,962,626 11/1960 Berg et al. ---------- 315—27

RODNEY D. BENNETT, Jr., Primary Examiner

J. G. BAXTER, Assistant Examiner

U.S. Cl. X.R.

331—111, 117